(12) United States Patent
Huang et al.

(10) Patent No.: US 10,020,343 B2
(45) Date of Patent: Jul. 10, 2018

(54) WAFER-LEVEL BACK-END FABRICATION SYSTEMS AND METHODS

(71) Applicant: FLIR Systems, Inc., Wilsonville, OR (US)

(72) Inventors: Edward K. Huang, Thousand Oaks, CA (US); Andrew D. Hood, Ventura, CA (US); Bryan Gall, Ventura, CA (US); Paula Heu, Santa Barbara, CA (US); Richard E. Bornfreund, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 0 days.

(21) Appl. No.: 15/275,134

(22) Filed: Sep. 23, 2016

(65) Prior Publication Data

US 2017/0207271 A1    Jul. 20, 2017

Related U.S. Application Data

(60) Provisional application No. 62/233,056, filed on Sep. 25, 2015.

(51) Int. Cl.
*H01L 27/146* (2006.01)
*H04N 5/33* (2006.01)

(52) U.S. Cl.
CPC .... *H01L 27/14687* (2013.01); *H01L 27/1462* (2013.01); *H01L 27/1465* (2013.01); *H01L 27/1469* (2013.01); *H01L 27/14634* (2013.01); *H01L 27/14685* (2013.01); *H01L 27/14694* (2013.01); *H01L 27/14696* (2013.01); *H01L 27/14698* (2013.01); *H04N 5/33* (2013.01)

(58) Field of Classification Search
CPC ......... H01L 27/14687; H01L 27/14634; H01L 27/1462; H01L 27/1465; H01L 27/14694; H01L 27/14698; H01L 27/1469; H01L 27/14685; H01L 27/14696; H04N 5/33
USPC .................................................... 438/478, 65
See application file for complete search history.

(56) References Cited

U.S. PATENT DOCUMENTS

| | | | |
|---|---|---|---|
| 5,304,500 A | 4/1994 | Timlin et al. | |
| 8,338,200 B2 | 12/2012 | Forrai et al. | |
| 2011/0233609 A1 | 9/2011 | Cordat et al. | |
| 2015/0102447 A1* | 4/2015 | Huet | H01L 27/1465 257/433 |

\* cited by examiner

*Primary Examiner* — Caleen Sullivan
(74) *Attorney, Agent, or Firm* — Haynes and Boone, LLP

(57) ABSTRACT

Systems and methods may be provided for fabricating infrared focal plane arrays. The methods include providing a device wafer, applying a coating to the device wafer, mounting the device wafer to a first carrier wafer, thinning the device wafer while the device wafer is mounted to the first carrier wafer, releasing the device wafer from the first carrier wafer, singulating the device wafer into individual dies, each die having an infrared focal plane array, and hybridizing the individual dies to a read out integrated circuit.

20 Claims, 17 Drawing Sheets

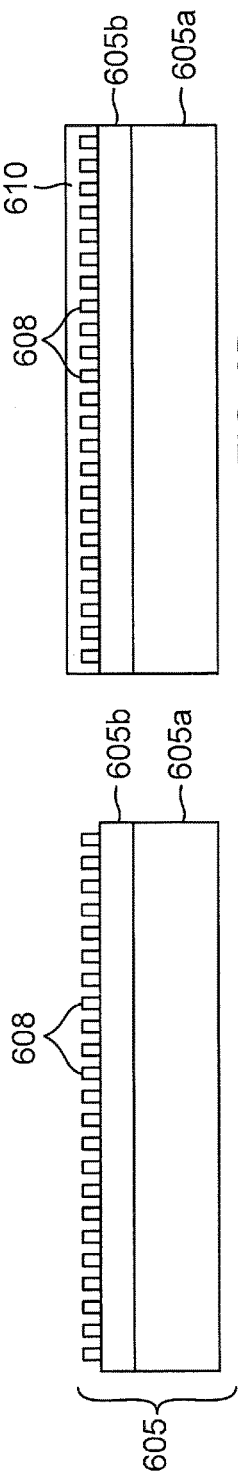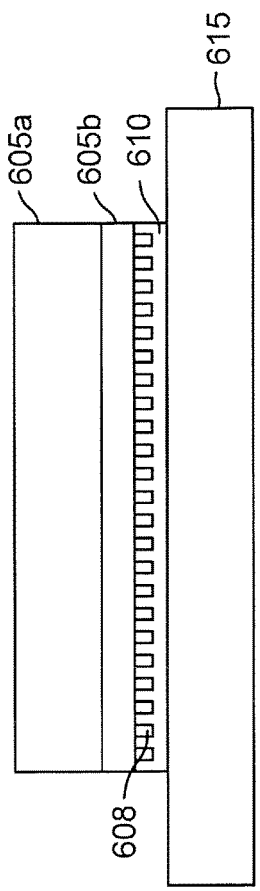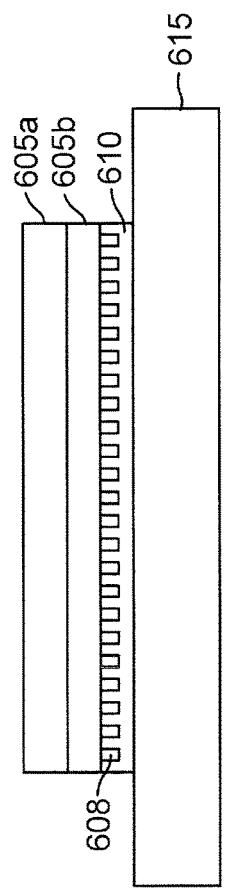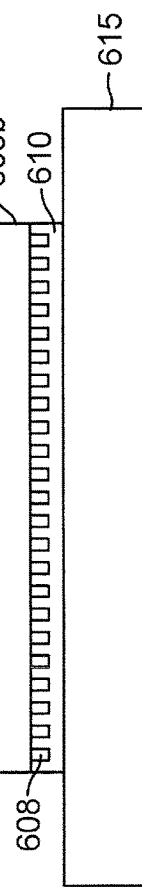

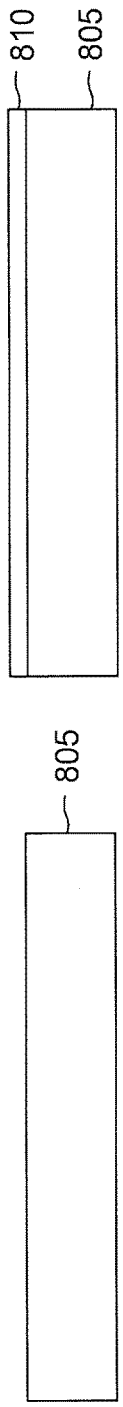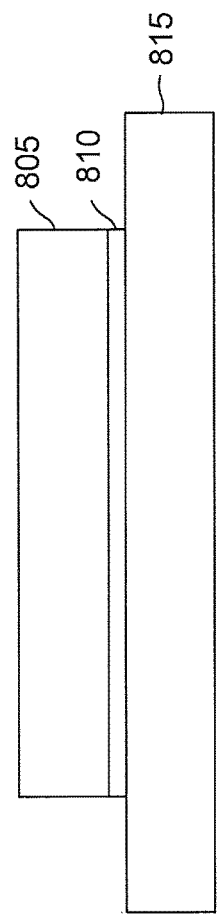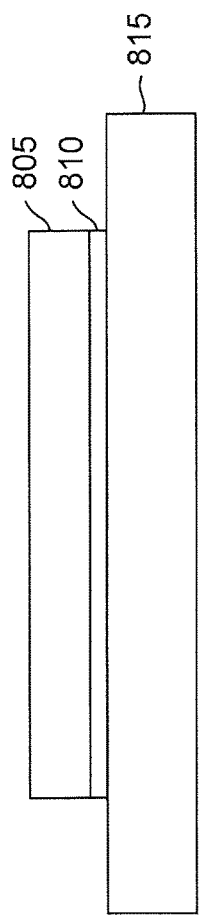
FIG. 8A    FIG. 8B    FIG. 8C    FIG. 8D

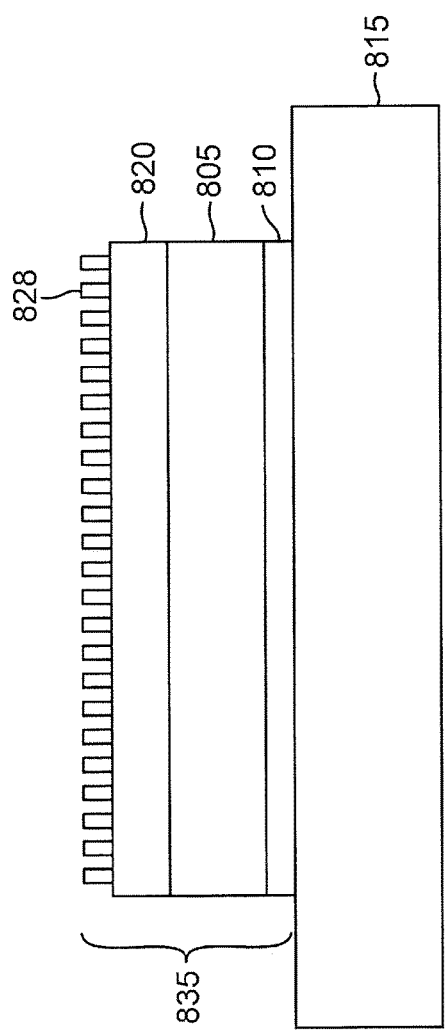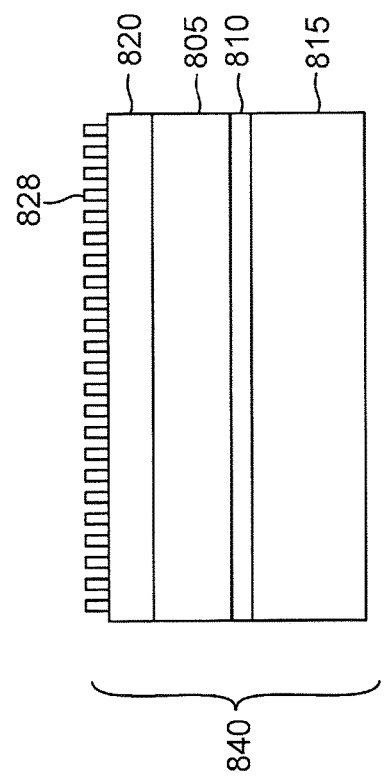

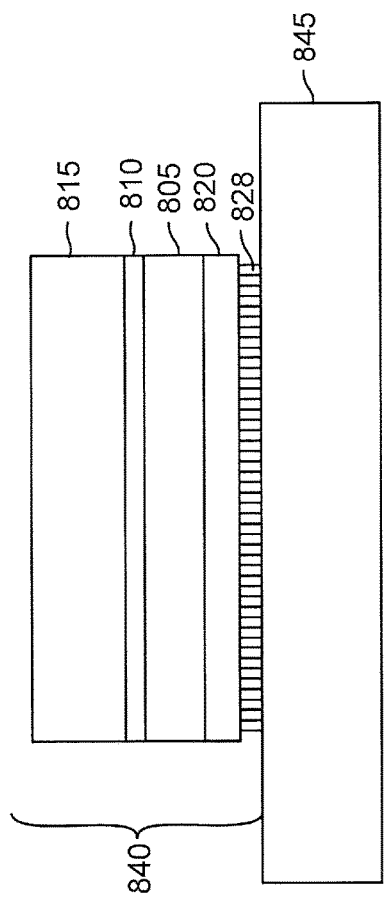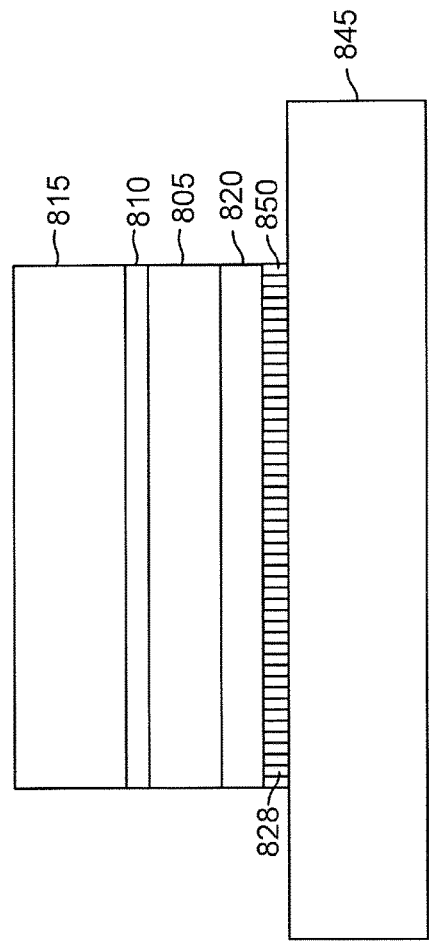

WAFER-LEVEL BACK-END FABRICATION SYSTEMS AND METHODS

CROSS-REFERENCE TO RELATED APPLICATIONS

This application claims priority to and the benefit of U.S. Provisional Patent Application No. 62/233,056, filed Sep. 25, 2015 and entitled "WAFER-LEVEL BACK-END FABRICATION SYSTEMS AND METHODS," which is hereby incorporated by reference in its entirety.

STATEMENT REGARDING GOVERNMENT SUPPORT

This invention was made with government support under FA8650-14-C-5508 awarded by the United States Air Force. The government has certain rights in the invention.

TECHNICAL FIELD

One or more embodiments of the invention relate generally to infrared cameras and, more particularly, to manufacturing focal plane arrays at the wafer-level.

BACKGROUND

Dies, such as focal plane arrays, are typically produced collectively in arrays on wafer substrates. Back-end or back-end of line fabrication of focal plane arrays is often performed serially after front-end wafer-level detector processing. Entire wafers are generally front-end processed and singulated, and then back-end processing is performed at a die-level. Back-end processing can include processes such as thinning, polishing, coating, and hybridizing. Typically, thinning, polishing, coating, and hybridizing processes are performed after singulating the wafer into individual dies. Thus, if there are ten arrays on a wafer, the thinning process is performed ten different times, resulting in a time-consuming and expensive processing technique. As a result, a significant portion of focal plane array cost is attributed to the traditional approach of back-end of line fabrication. The traditional approach of wafer-level processing without a carrier has been tried, but has been typically abandoned because of damage that occurs to the backside optical surface during backside processing.

As a result, there is a need for improved techniques for fabricating focal plane arrays for imaging devices such as Group III-V and II-IV compound semiconductors for infrared cameras.

SUMMARY

The present disclosure describes systems and methods that perform the majority of back-end of line manufacturing steps of infrared focal plane arrays at the wafer-level, rather than at the die-level. Such steps may include all steps prior to a hybridization step, and may include polishing, substrate removal, and coating. These steps are performed on a plurality of dies at the same time, rather than on one die at a time. Thus, the back-end of line process is simplified, and the time and cost of the back-end of line process is reduced. That is, after the front-end processes on a detector wafer's surface have been completed, the back-end process may be directly performed on the entire wafer, and then the wafer can be singulated to form a plurality of focal plane arrays.

According to an embodiment, a method is disclosed for fabricating an infrared focal plane array. The method includes providing a device wafer, applying a coating to the device wafer, mounting the device wafer to a first carrier wafer, thinning the device wafer while the device wafer is mounted to the first carrier wafer, releasing the device wafer from the first carrier wafer, singulating the device wafer into individual dies, each die having an infrared focal plane array, and hybridizing the individual dies to a read out integrated circuit.

According to another embodiment, a method is disclosed for fabricating an infrared focal plane array. The method includes providing a detector wafer comprising a substrate and a detector layer, applying a first protective coating over the detector layer, thinning the substrate while the first protective coating is over the detector layer, and applying an antireflective coating over the thinned substrate while the first protective coating is over the detector layer. The first protective coating mechanically supports the detector wafer.

According to another embodiment, a method is disclosed for fabricating an infrared focal plane array. The method includes providing a wafer comprising a substrate and an antireflective coating, mounting the wafer to a carrier wafer, thinning the substrate, and forming one or more detector layers over the substrate. The thinning and the forming are performed at a wafer level.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 6A-6L show cross-sectional side views of a wafer subjected to the method illustrated in FIG. 5.

FIGS. 8A-8I show cross-sectional side views of a wafer subjected to the method illustrated in FIG. 7.

Embodiments of the invention and their advantages are best understood by referring to the detailed description that follows. It should be appreciated that like reference numerals are used to identify like elements illustrated in one or more of the figures.

DETAILED DESCRIPTION

Systems and methods are disclosed herein to provide enhanced fabrication of infrared focal plane arrays. The majority of the back-end fabrication steps are performed at the wafer-level, which extends the die-level fabrication of the focal plane arrays as close as possible to the end of the manufacturing process. Such steps performed at the wafer level include polishing, substrate removal, application of an antireflective coating, and application of a protective coating. The processes described herein may be applied to any Group III-IV and II-VI compound semiconductors such as indium antimonide (InSb) and indium gallium arsenide (InGaAs), superlattices (SLS), quantum well infrared photodetectors (QWIPs), and mercury cadmium telluride.

In various embodiments, carrier wafers are used to mechanically support thinned detector wafers, and serve as a protective mechanical barrier to scratching of the antireflective coating, which in some embodiments is deposited prior to carrier mounting. At a later step, the carrier wafer can be released to eliminate any unwanted absorption in the light path of the final focal plane array assembly. Otherwise, if the carrier wafer remains intact, an infrared (IR) transparent carrier within the waveband of interest can be utilized to minimize absorption effects.

Figure 1:
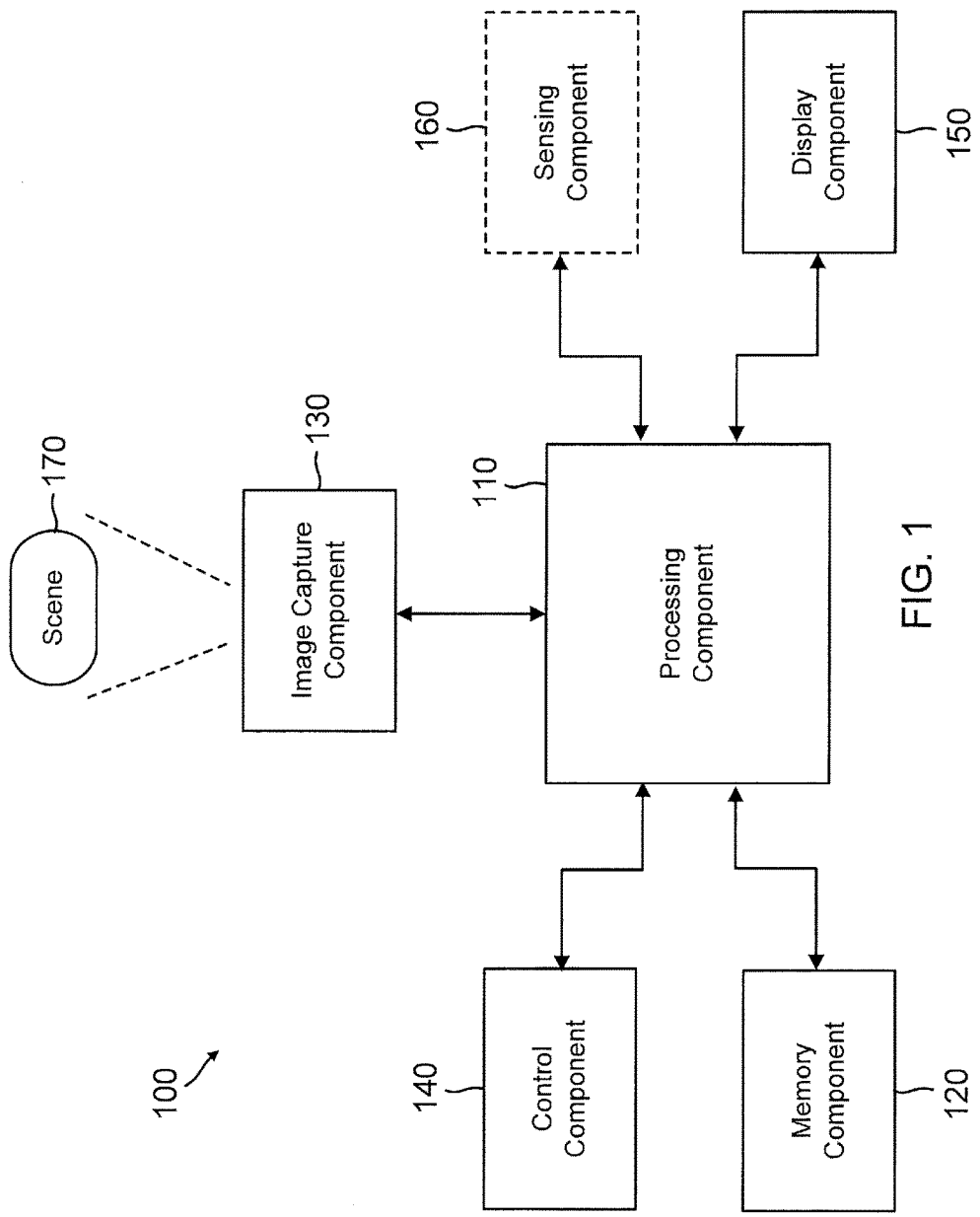
FIG. 1 shows a block diagram illustrating a system for capturing images in accordance with an embodiment.

Referring now to FIG. 1, a block diagram is shown illustrating a system 100 (e.g., an infrared camera) for capturing and processing images in accordance with one or more embodiments. System 100 may include, in one implementation, a processing component 110, a memory component 120, an image capture component 130, a control component 140, and a display component 150. Optionally, system 100 may include a sensing component 160.

System 100 may represent for example an infrared imaging device, such as an infrared camera, to capture and process images, such as video images of a scene 170. The system 100 may represent any type of infrared camera adapted to detect infrared radiation and provide representative data and information (e.g., infrared image data of a scene) or may represent more generally any type of electro-optical sensor system. System 100 may comprise a portable device and may be incorporated, e.g., into a vehicle (e.g., an automobile or other type of land-based vehicle, an aircraft, a marine craft, or a spacecraft) or a non-mobile installation requiring infrared images to be stored and/or displayed or may comprise a distributed networked system.

In various embodiments, processing component 110 may comprise any type of a processor or a logic device (e.g., a programmable logic device (PLD) configured to perform processing functions). Processing component 110 may be adapted to interface and communicate with components 120, 130, 140, and 150 to perform method and processing steps and/or operations, as described herein such as controlling biasing and other functions (e.g., values for elements such as variable resistors and current sources, switch settings for timing such as for switched capacitor filters, ramp voltage values, etc., depending on the type of applications and image capture component) along with conventional system processing functions as would be understood by one skilled in the art.

Memory component 120 comprises, in one embodiment, one or more memory devices adapted to store data and information, including for example infrared data and information. Memory device 120 may comprise one or more various types of memory devices including volatile and non-volatile memory devices. Processing component 110 may be adapted to execute software stored in memory component 120 so as to perform method and process steps and/or operations described herein.

Image capture component 130 comprises, in one embodiment, any type of image sensor, such as for example one or more infrared sensors (e.g., any type of multi-pixel infrared detector, such as a focal plane array with a photovoltaic detector or other types of infrared detectors) for capturing infrared image data (e.g., still image data and/or video data) representative of an image, such as scene 170. In some embodiments, the focal plane array is manufactured according to the methods described herein. In one implementation, the infrared sensors of image capture component 130 provide for representing (e.g., converting) the captured image data as digital data (e.g., via an analog-to-digital converter included as part of the infrared sensor or separate from the infrared sensor as part of system 100). In one aspect, the infrared image data (e.g., infrared video data) may include non-uniform data (e.g., real image data) of an image, such as scene 170. Processing component 110 may be adapted to process the infrared image data (e.g., to provide processed image data), store the infrared image data in memory component 120, and/or retrieve stored infrared image data from memory component 120. For example, processing component 110 may be adapted to process infrared image data stored in memory component 120 to provide processed image data and information (e.g., captured and/or processed infrared image data).

Control component 140 may include, in one embodiment, a user input and/or interface device, such as a rotatable knob (e.g., potentiometer), push buttons, slide bar, keyboard, etc., that is adapted to generate a user input control signal. Processing component 110 may be adapted to sense control input signals from a user via control component 140 and respond to any sensed control input signals received therefrom. Processing component 110 may be adapted to interpret such a control input signal as a parameter value, as generally understood by one skilled in the art.

In one embodiment, control component 140 may include a control unit (e.g., a wired or wireless handheld control unit) having push buttons adapted to interface with a user and receive user input control values. In one implementation, the push buttons of the control unit may be used to control various functions of the system 100, such as autofocus, menu enable and selection, field of view, brightness, contrast, noise filtering, high pass filtering, low pass filtering, and/or various other features as understood by one skilled in the art.

Display component 150 may include, in one embodiment, an image display device (e.g., a liquid crystal display (LCD) or various other types of generally known video displays or monitors). Processing component 110 may be adapted to display image data and information on the display component 150. Processing component 110 may be adapted to retrieve image data and information from memory component 120 and display any retrieved image data and information on display component 150. Display component 150 may include display electronics, which may be utilized by processing component 110 to display image data and information (e.g., infrared images). Display component 150 may be adapted to receive image data and information directly from image capture component 130 via the processing component 110, or the image data and information may be transferred from memory component 120 via processing component 110.

Optional sensing component 160 may include, in one embodiment, one or more sensors of various types, depending on the application or implementation requirements, as would be understood by one skilled in the art. The sensors of optional sensing component 160 provide data and/or information to at least processing component 110. In one aspect, processing component 110 may be adapted to communicate with sensing component 160 (e.g., by receiving sensor information from sensing component 160) and with image capture component 130 (e.g., by receiving data and information from image capture component 130 and providing and/or receiving command, control, and/or other information to and/or from one or more other components of system 100).

In various implementations, sensing component 160 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 160 may represent conventional sensors as generally known by one skilled in the art for monitoring various conditions (e.g., environmental conditions) that may have an effect (e.g., on the image appearance) on the data provided by image capture component 130.

In some implementations, optional sensing component 160 (e.g., one or more of sensors) may include devices that relay information to processing component 110 via wired and/or wireless communication. For example, optional sensing component 160 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 100 may be combined and/or implemented or not, as desired or depending on the application or requirements, with system 100 representing various functional blocks of a related system. In one example, processing component 110 may be combined with memory component 120, image capture component 130, display component 150, and/or optional sensing component 160. In another example, processing component 110 may be combined with image capture component 130 with only certain functions of processing component 110 performed by circuitry (e.g., a processor, a microprocessor, a logic device, a microcontroller, etc.) within image capture component 130. Furthermore, various components of system 100 may be remote from each other (e.g., image capture component 130 may comprise a remote sensor with processing component 110, etc. representing a computer that may or may not be in communication with image capture component 130).

Figure 2:
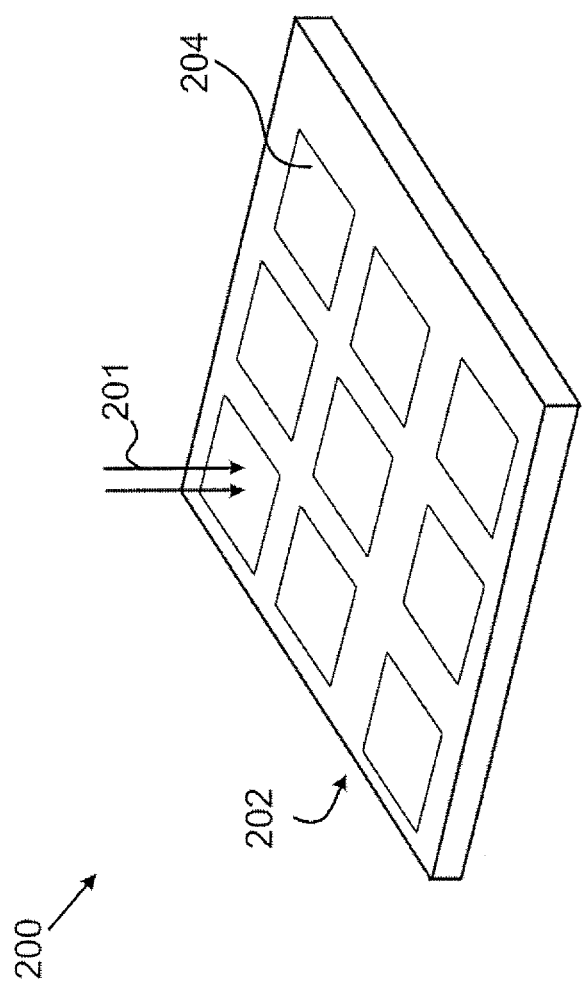
FIG. 2 shows a perspective view illustrating a focal plane array fabricated in accordance with an embodiment.

FIG. 2 shows a perspective view illustrating an infrared detector device 200 having an array 202 of infrared detector elements 204 that may be used to capture image data such as infrared image data for, for example, image capture component 130 of FIG. 1. The array 202 may have any number of infrared detector elements 204, and the infrared detector elements 204 may be any type of detector, including for example, thermocouples, thermopiles, pyroelectric detectors, and photovoltaic detectors. The detector elements 204 may be coupled to associated readout circuitry as discussed further herein.

In one suitable configuration that is sometimes discussed herein as an example, device 200 may be a focal plane array that may be implemented in, for example, image capture component 130 of FIG. 1. Each detector element 204 may be formed from one or more layers of material such as one or more absorber layers, one or more passivation layers, one or more temperature sensitive resistive layers, one or more cap layers, one or more overglass layers, one or more antireflective layers, and/or other layers or elements.

In a focal plane array configuration, ROIC 210 may include a ROIC substrate formed from silicon or germanium (as examples). Detector elements 204 may be arranged to convert incident light such as infrared light 201 into, for example, detectable electrical signals based on changes in electrical properties of the detector element when the light 201 is incident. Each infrared detector element 204 may be coupled to a ROIC for processing and reading out the electrical signals, as would be understood by one skilled in the art.

ROIC may incorporate circuitry that is placed in spatial proximity to the detector elements 204 to perform the functions of detector interface and multiplexing. The ROIC circuitry associated with detector elements 204 may, for example, be located in a separate substrate and may include an array of unit cells, column amplifiers, a column multiplexer, and a row multiplexer integrated on to a single ROIC silicon die, or other type of circuitry depending on the type of detector and particular application. Each detector element 204 in the array 202 may communicate with the ROIC.

Referring to FIG. 3 and FIGS. 4A-4G, a method 300 for fabricating a focal plane array is described. At step 302 and FIG. 4A, a device wafer 405 is provided. The device wafer 405 may or may not be front-side processed. In embodiments where the wafer 405 has been front-side processed, a wafer measuring 3 inches across may include 30 detector dies, and a wafer measuring 4 inches across may include 60 detector dies.

Figure 4A:
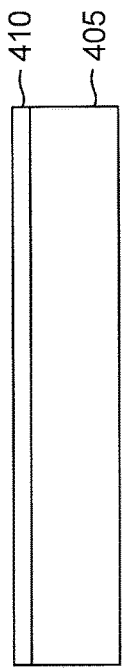
FIGS. 4A-4G show cross-sectional side views of a wafer subjected to the method illustrated in FIG. 3.
Figure 4B:
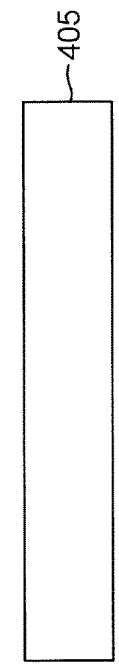

At step 302 and FIG. 4B, a coating 410 is applied to the device wafer. In one embodiment, the coating 410 is a protective coating, and an adhesive tape or a spin-on photoresist is applied to the active or patterned surface of the wafer to protect the circuitry. For example, photoresist material is applied and then cured to form the protective coating 410.

In another embodiment, the coating 410 is an antireflective coating. The composition of the antireflective coating depends on the wavelength that should be reflected. The antireflective coating may be a single layer or consist of multiple layers. For example, the antireflective coating may include a series or stack of dielectric antireflection coatings having the desired properties.

Figure 4C:
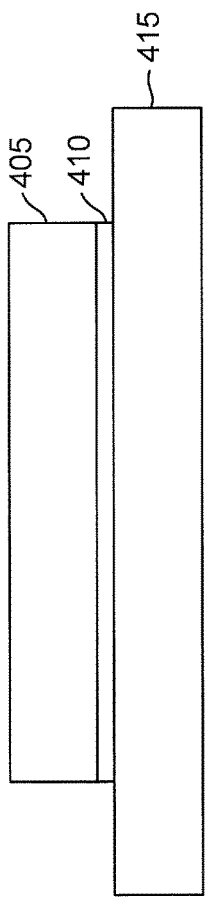

At step 306 and FIG. 4C, the device wafer 405 is bound or mounted to a carrier wafer 415. The carrier wafer 415 provides mechanical support to the device wafer 405 as the device wafer 405 is sent through the various processing steps. A polymeric adhesive (e.g., epoxy) may be used to bond the device wafer 405 to the carrier wafer 415. The polymeric adhesives used for temporary wafer bonding are typically applied by spin coating or spray coating from solution or laminating as dry-film tapes. The polymeric adhesives should exhibit high bonding strength to the device wafer 405 and the carrier wafer 415.

Common carrier materials include silicon (e.g., a blank device wafer), soda lime glass, borosilicate glass, sapphire, and various metals and ceramics. The carrier material is, in several embodiments, inexpensive and closely matches the thermal expansion properties of the detector and substrate material of the device wafer. The carriers may be square, rectangular, or round but are typically sized to match the device wafer so that the bonded assembly can be handled in conventional processing tools and cassettes.

Figure 4D:
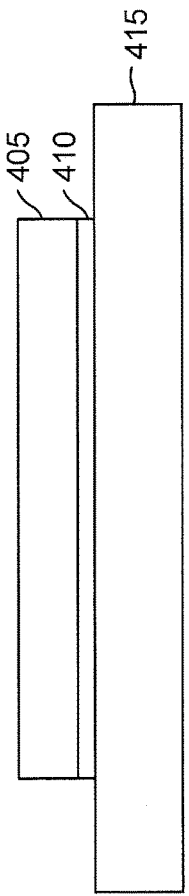

At step 308 and FIG. 4D, the backside or inactive side of the device wafer 405 is ground, thinned, and/or polished until the device wafer 405 reaches a desired thickness. The device wafer 405 may be thinned by mechanical and/or chemical polishing or any other technique. A variety of wafer thinning techniques have been proposed and used, ranging from machines providing simple mechanical abrasion using, e.g., an abrasive grinding wheel, to chemical etching and polishing techniques, back side grinder, and combinations of these, e.g. chemical mechanical polishing (CMP).

Figure 4F:
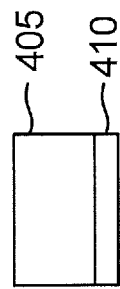
Figure 4E:
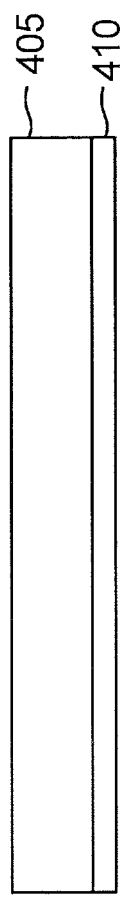

At step 310 and FIG. 4E, the device wafer 405 is released from the carrier wafer 415. Once the processing steps are performed, a mechanical device may be used to debond and/or demount the device wafer 405 from the carrier wafer 415. Thermal, thermomechanical, or chemical processes may also be used to remove or debond the device wafer 405 from the carrier wafer 415.

In some embodiments, the carrier wafer 415 and device wafer 405 are not separated. In these cases, the carrier wafer 415 is a transparent carrier within the waveband of interest that minimizes absorption effects. The transparent carrier is transparent to radiation in the desired wavelength, such as wavelengths in the infrared or near-infrared spectrum. In various embodiments, the transparent carrier is made of a material that is substantially transparent to radiation in the infrared spectral range, such as float zone silicon.

At step 312 and FIG. 4F, the device wafer 405 is singulated into individual dies. After the processing steps are completed, the wafers are singulated, separating the die from the wafer. This "dicing," separation or singulating operation is commonly carried out by sawing through the "streets" between the dies within the wafers.

Figure 4G:
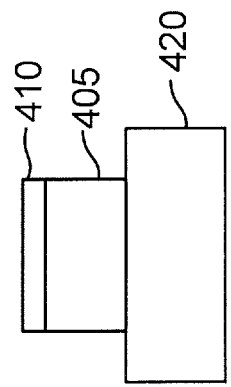

At step 314 and FIG. 4G, the individual dies are hybridized or bonded to a ROIC 420. The hybridization process includes permanently mechanically and electrically bonding the detector of the device wafer 405 and the ROIC 420 through use of metallic bonds between conductive contacts of the detector and conductive contacts of the ROIC 420. In one embodiment, the die may be bump-bonded to the ROIC 420 using bonding bumps, a technique well known to those skilled in the art.

Referring now to FIG. 5 and FIGS. 6A-6L, a detailed method 500 for fabricating a focal plane array is described. At step 502 and FIG. 6A, a detector wafer 605 including substrate 605a and a detector layer 605b or detector components is provided. The detector layer 605b includes a plurality of interconnects 608. In various embodiments, the interconnects 608 are formed from one or more metals. In this embodiment, the substrate 605a is front-side processed to include the active circuitry and components of the focal plane array.

At step 504 and FIG. 6B, a first protective coating 610 is applied over the detector layer 605b and the interconnects 608. As explained above, a protective coating acts to protect the active components of the detector wafer during processing.

At step 506 and FIG. 6C, the front side or active side of the detector wafer 605 is bonded to a first carrier wafer 615. In some embodiments, the first carrier wafer 615 is not needed because the first protective coating 610 is robust enough to mechanically support the detector wafer 605. For example, the first protective coating 610 may include a spin-on glass or an abrasion resistant layer at a thickness that provides sufficient strength and support to the detector wafer 605.

At step 508 and FIG. 6D, the backside or inactive side of the substrate 605a of the detector wafer 605 is thinned.

Figure 6E:
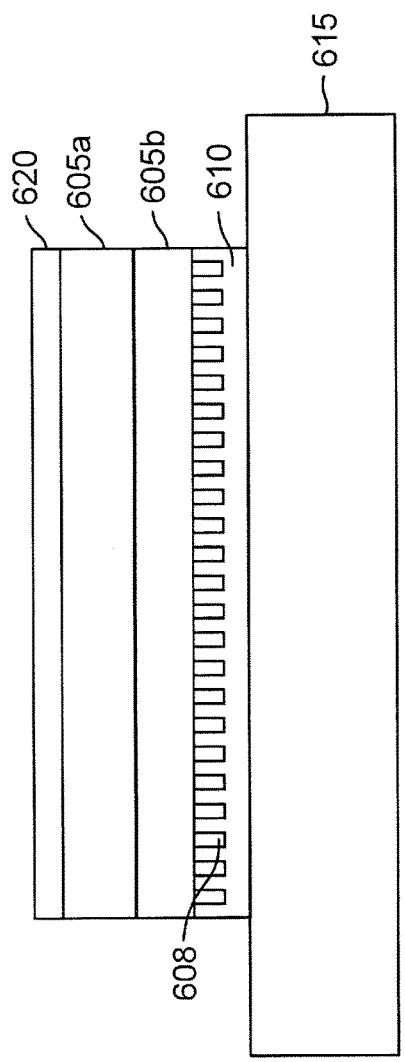

At step 510 and FIG. 6E, an antireflective coating 620 is applied over the backside of the thinned substrate 605a.

Figure 6F:
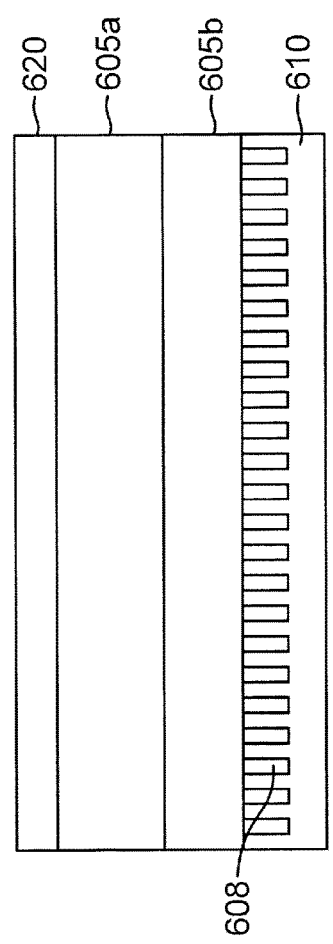

At step 512 and FIG. 6F, the detector wafer 605 is released from the first carrier wafer 615.

Figure 6G:
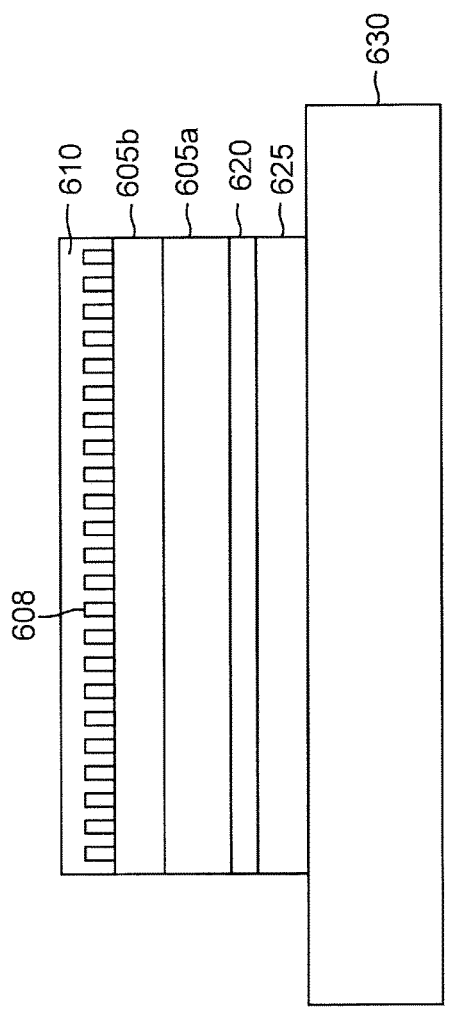

At step 514 and FIG. 6G, a second protective coating 625 is applied over the antireflective coating 620 and the backside of the detector wafer 605 is bonded to a second carrier wafer 630. The second carrier wafer 630 may not be needed in cases where the second protective coating 625 and/or the first protective coating 610 are strong enough to mechanically support the detector wafer 605.

Figure 6H:
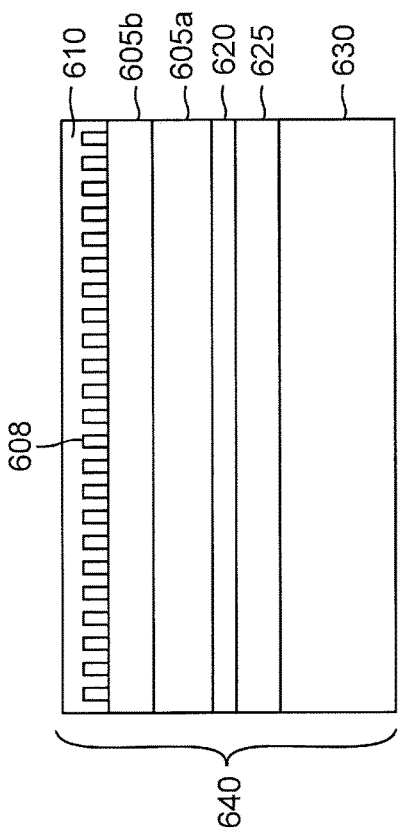

At step 516 and FIG. 6H, the detector wafer 605 and second carrier wafer 630 are singulated into individual dies 640.

Figure 6I:
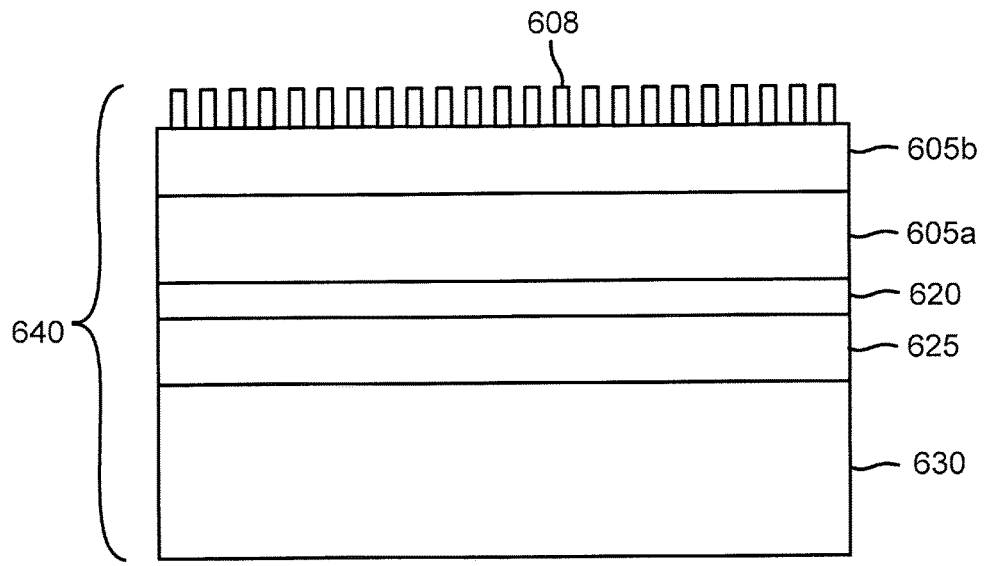

At step 518 and FIG. 6I, the first protective coating 610 is removed from the dies 640 using methods known in the art. For example, the first protective coating may be removed by wet stripping or oxygen plasma ashing.

Figure 6J:
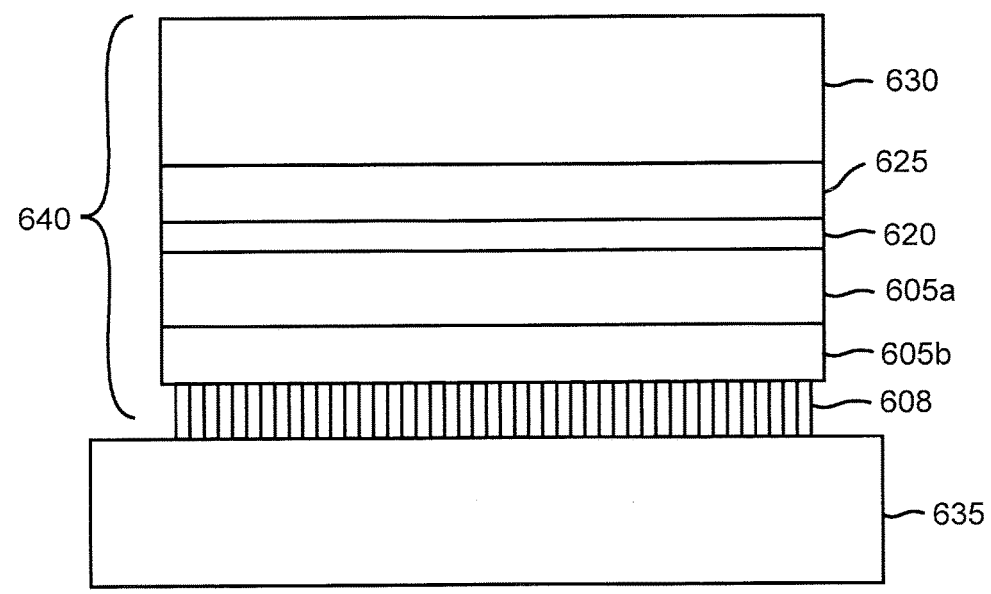

At step 520 and FIG. 6J, the individual dies 640 are hybridized to a ROIC 635. For example, the interconnects 608 may be connected to conductive contacts of the ROIC 635.

Figure 6K:
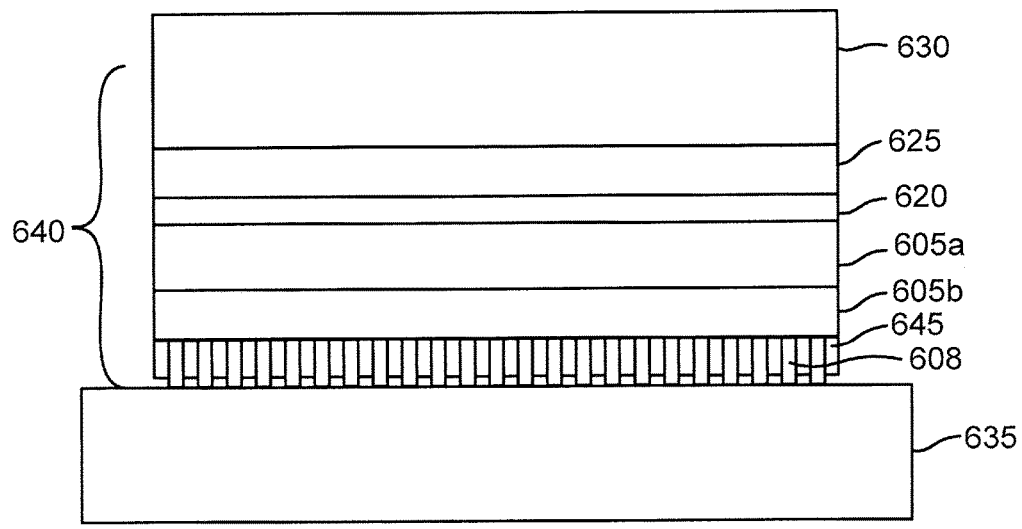

At step 522 and FIG. 6K, the gaps between the detector layer 605b and the ROIC 635 is back-filled with a thermally conductive material 645, for example, an epoxy. This step is not needed in all cases, but may be used to reinforce the interconnects 608.

Figure 6L:
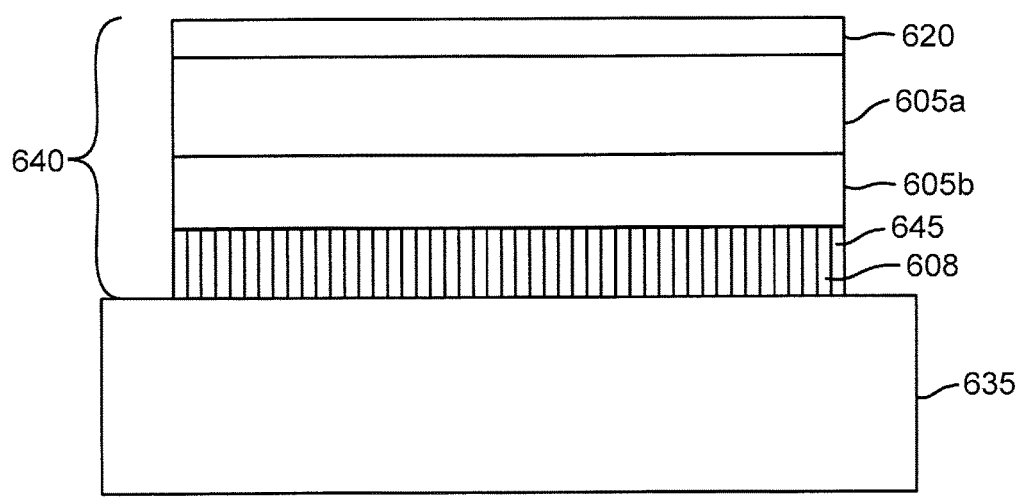

At step 524 and FIG. 6L, the individual dies 640 are released from the second carrier wafer 630 and the second protective coating 625 is removed.

Referring now to FIG. 7 and FIGS. 8A-8I, another detailed method 700 for fabricating a focal plane array is described. At step 702 and FIG. 8A, a substrate 805 is provided.

At step 704 and FIG. 8B, an antireflective coating 810 is applied over the substrate 805.

At step 706 and FIG. 8C, the substrate 805 is bonded to a carrier wafer 815.

At step 708 and FIG. 8D, the substrate 805 is thinned.

At step 710 and FIG. 8E, a detector layer 820 or detector components is formed over the substrate to form a detector wafer 835. The detector layer 820 includes a plurality of interconnects 828.

At step 712 and FIG. 8F, the detector wafer 835 and carrier wafer 815 are singulated into individual dies 840.

At step 714 and FIG. 8G, the individual dies 840 are hybridized to a ROIC 845.

At step 716 and FIG. 8H, the gap between the detector layer 820 and the ROIC 845 is back-filled with a thermally conductive material 850, for example an epoxy. This step is not required in all cases.

Figure 8I:
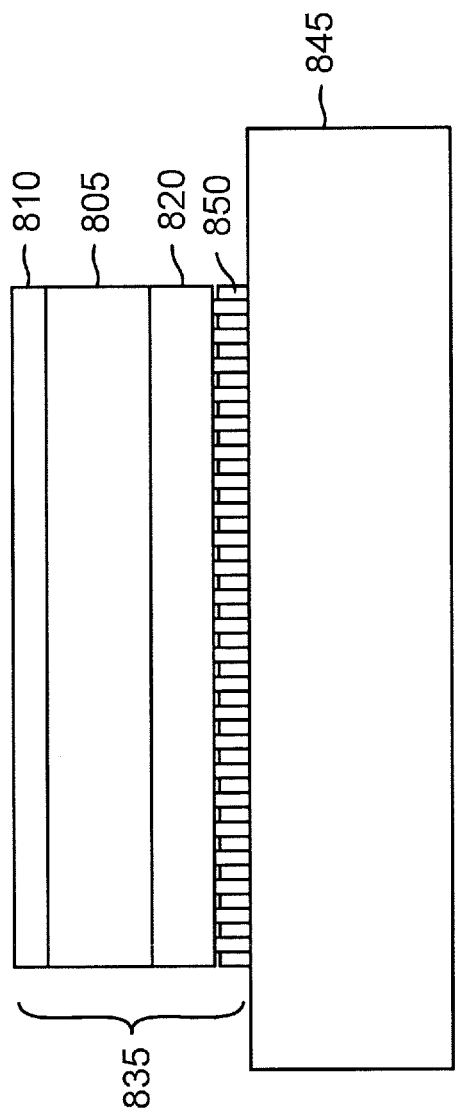

At step 718 and FIG. 8I, the detector wafer 835 is released from the carrier wafer 815.

Figure 3:
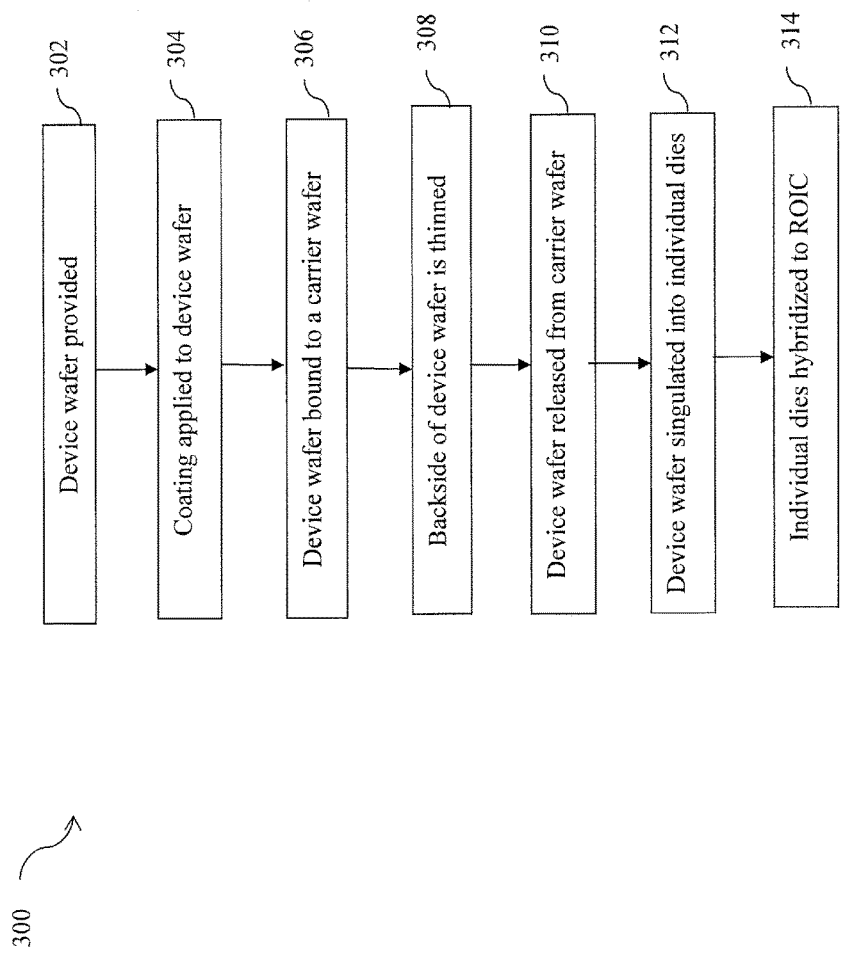
FIG. 3 shows one flow diagram illustrating a method of fabricating a focal plane array in accordance with an embodiment.
Figure 5:
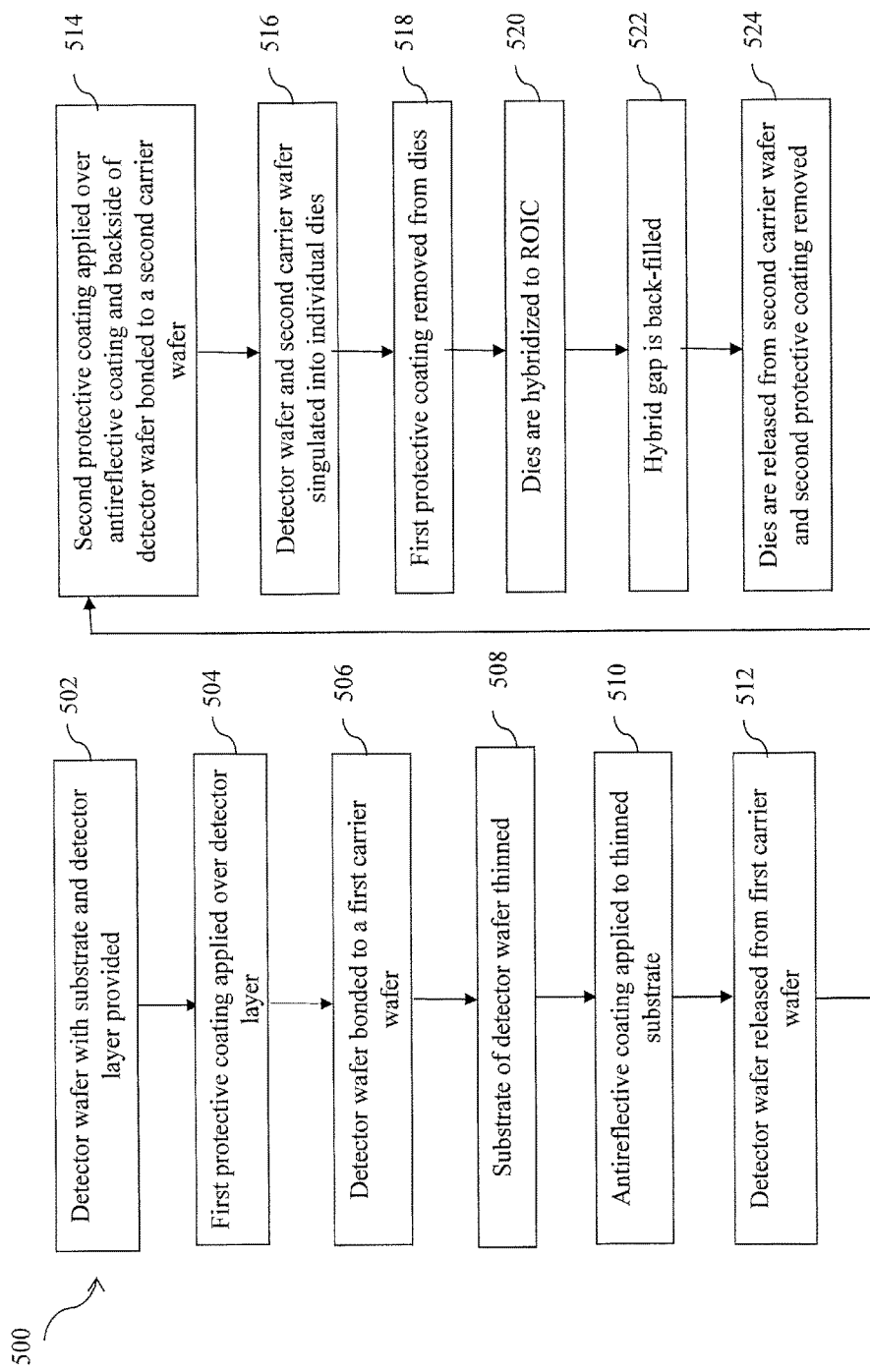
FIG. 5 shows a second flow diagram illustrating a method of fabricating a focal plane array in accordance with an embodiment.
Figure 7:
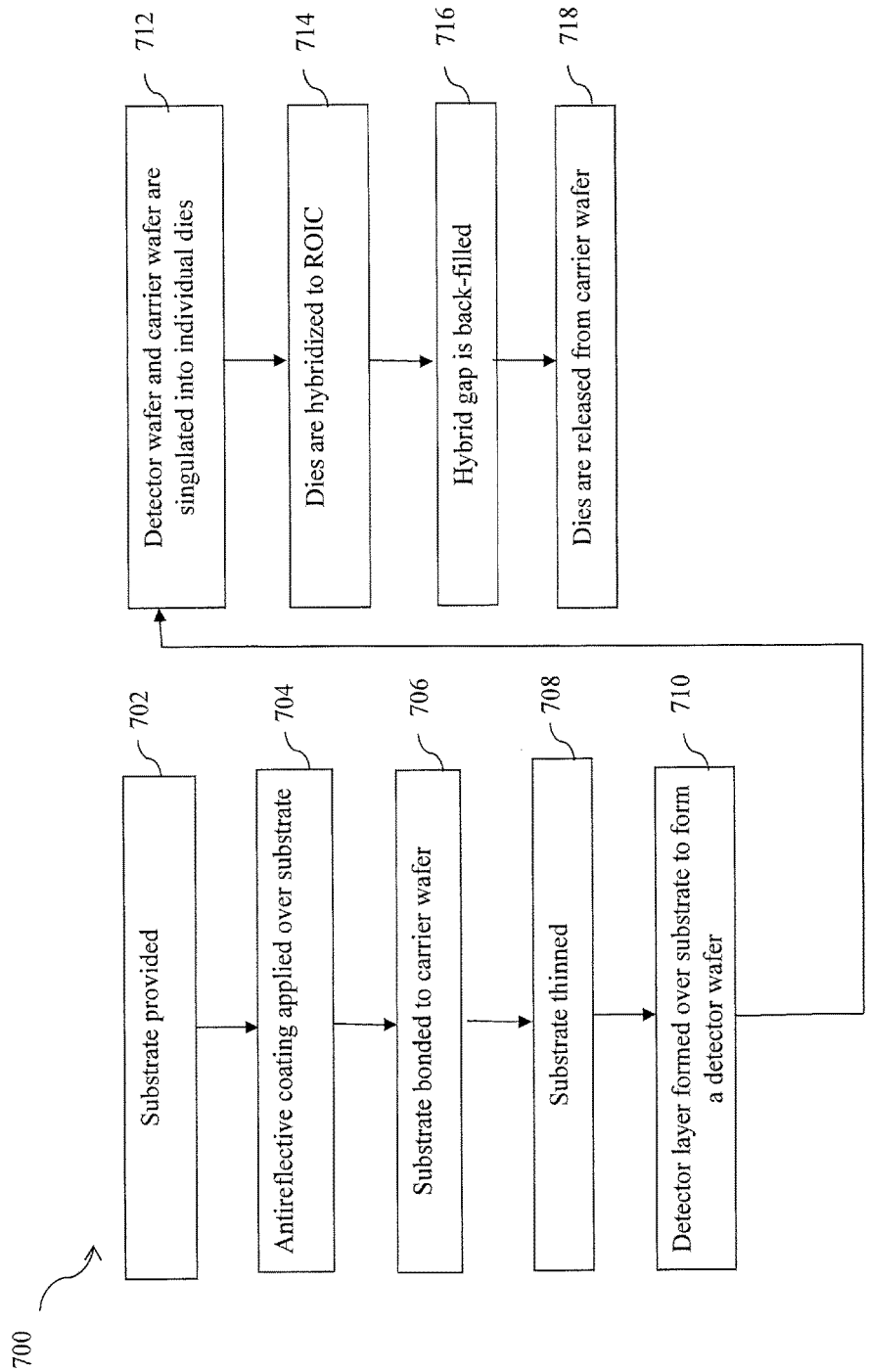
FIG. 7 shows a third flow diagram illustrating a method of fabricating a focal plane array in accordance with an embodiment.

As would be understood by one skilled in the art, at various stages during the processes of FIGS. 3, 5, and 7, other layers such as passivation layers, photoresist layers, additional sacrificial layers, antireflection layers, and/or other suitable layers may be deposited, patterned and/or removed in whole or in part to form, for example, the structures of FIGS. 4G, 6L, and 8I.

Figure 9:
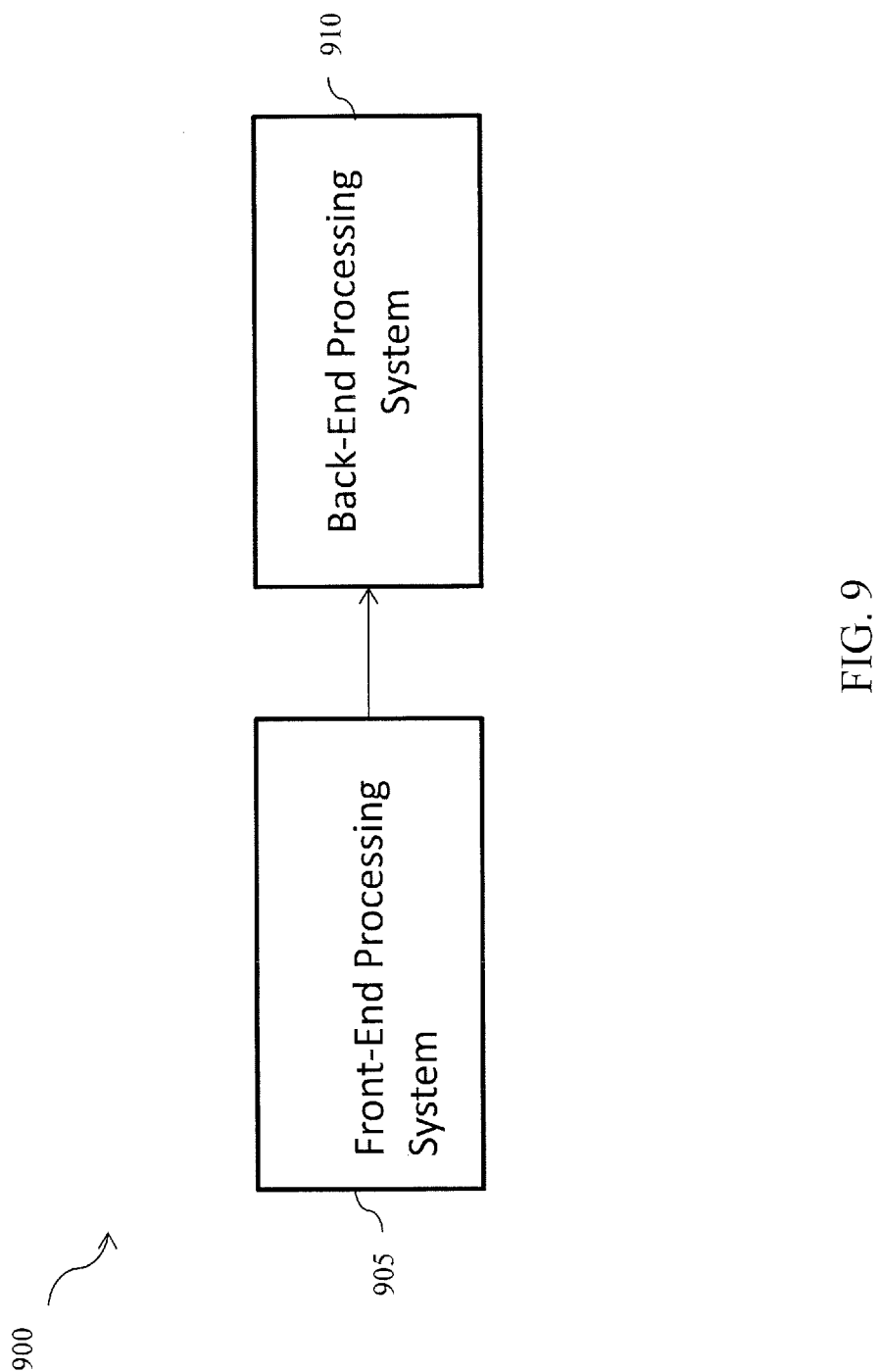
FIG. 9 illustrates a block diagram of a system for fabricating a focal plane array in accordance with an embodiment.

FIG. 9 illustrates a system 900 that may be used to fabricate a focal plane array in accordance with one or more embodiments. System 900 includes front-end processing system 905 and a back-end processing system 910. Front-end processing system 905 performs various front-end processing steps such as forming the detector layer and interconnects. Back-end processing system 910 performs various back-end processing steps such as thinning, polishing, coating, hybridizing, and singulating wafers.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method of fabricating an infrared focal plane array, comprising:
   providing a device wafer;
   applying a coating to the device wafer;
   mounting the device wafer to a carrier wafer;
   thinning the device wafer while the device wafer is mounted to the carrier wafer;
   singulating the device wafer into individual dies, each die having an infrared focal plane array;
   hybridizing the individual dies to a read out integrated circuit; and
   releasing the device wafer from the carrier wafer after hybridizing the individual dies.

2. The method of claim 1, wherein:
   the coating comprises at least one of a protective coating or an antireflective coating; and
   the device wafer comprises a substrate on a backside of the device wafer and a detector layer on a frontside of the device wafer.

3. The method of claim 1, further comprising forming one or more detector layers on a frontside of the device wafer while the carrier wafer is mounted; and wherein the device wafer comprises a substrate and an antireflective coating.

4. A method of fabricating an infrared focal plane array, comprising:
   providing a device wafer;
   applying a coating to the device wafer;
   mounting the device wafer to a carrier wafer;
   thinning the device wafer while the device wafer is mounted to the carrier wafer;
   releasing the device wafer from the carrier wafer;
   mounting a second carrier wafer to the backside of the device wafer after the release of the device wafer from the carrier wafer;
   singulating the device wafer and the second carrier wafer into individual dies, each die having an infrared focal plane array; and
   hybridizing the individual dies to a read out integrated circuit.

5. The method of claim 4, further comprising releasing the second carrier wafer after hybridizing the individual dies.

6. The method of claim 4, wherein the second carrier wafer is substantially transparent to infrared radiation, and further comprising retaining the second carrier wafer after hybridizing the individual dies.

7. An infrared imaging device, comprising:
   an infrared focal plane array fabricated according to the method of claim 1.

8. A system for performing the method of claim 1 comprising:
   a front-end processing system; and
   a back-end processing system.

9. A method of fabricating an infrared focal plane array, comprising:
   providing a detector wafer comprising a substrate and a detector layer;
   applying a first protective coating over the detector layer, wherein the first protective coating mechanically supports the detector wafer;
   thinning the substrate while the first protective coating is over the detector layer; and
   applying an antireflective coating over the thinned substrate while the first protective coating is over the detector layer.

10. The method of claim 9, further comprising applying a second protective coating over the antireflective coating, wherein the second protective coating mechanically supports the detector wafer.

11. The method of claim 10, further comprising:
   singulating the detector wafer into individual dies;
   removing the first protective coating;
   hybridizing the individual dies to a read out integrated circuit; and
   removing the second protective coating.

12. An infrared imaging device, comprising:
   an infrared focal plane array fabricated according to the method of claim 9.

13. A system for performing the method of claim 9 comprising:
   a front-end processing system; and
   a back-end processing system.

14. A method of fabricating an infrared focal plane array, comprising:
   providing a wafer comprising a substrate and an antireflective coating;
   mounting the wafer to a carrier wafer;
   thinning the substrate;
   forming one or more detector layers over the substrate, and
   singulating the wafer and the carrier wafer into individual dies;
   wherein the thinning and the forming are performed at a wafer level.

15. The method of claim 14, wherein singulating the wafer and the carrier wafer into individual dies occurs after forming the one or more detector layers.

16. The method of claim 15, further comprising hybridizing the individual dies to a read out integrated circuit.

17. The method of claim 16, further comprising releasing the carrier wafer after hybridizing the individual dies to a read out integrated circuit.

18. The method of claim 16, further comprising retaining the carrier wafer after hybridizing the individual dies, wherein the carrier wafer is substantially transparent to infrared radiation.

19. An infrared imaging device, comprising:
   an infrared focal plane array fabricated according to the method of claim 14.

20. A system for performing the method of claim 14 comprising:
   a front-end processing system; and
   a back-end processing system.

* * * * *

UNITED STATES PATENT AND TRADEMARK OFFICE
CERTIFICATE OF CORRECTION

PATENT NO. : 10,020,343 B2  
APPLICATION NO. : 15/275134  
DATED : July 10, 2018  
INVENTOR(S) : Edward K. Huang et al.

Page 1 of 1

It is certified that error appears in the above-identified patent and that said Letters Patent is hereby corrected as shown below:

In the Claims

In Claim 4, Column 9, Line 43, change "a carrier wafer" to --a first carrier wafer--.

In Claim 4, Column 9, Line 45, change "the carrier wafer" to --the first carrier wafer--.

In Claim 4, Column 9, Line 46, change "the carrier wafer" to --the first carrier wafer--.

In Claim 4, Column 9, Line 49, change "the carrier wafer" to --the first carrier wafer--.

Signed and Sealed this  
Eleventh Day of December, 2018

Andrei Iancu  
*Director of the United States Patent and Trademark Office*